United States Patent
Prokopp

(10) Patent No.: US 6,677,773 B2
(45) Date of Patent: Jan. 13, 2004

(54) TESTING DEVICE FOR PRINTED CIRCUIT BOARDS

(75) Inventor: Manfred Prokopp, Wertheim-Reicholzheim (DE)

(73) Assignee: atg test systems GmbH & Co. KG, Wertheim (DE)

( * ) Notice: Subject to any disclaimer, the term of this patent is extended or adjusted under 35 U.S.C. 154(b) by 0 days.

(21) Appl. No.: 10/245,905

(22) Filed: Sep. 17, 2002

(65) Prior Publication Data
US 2003/0020506 A1 Jan. 30, 2003

Related U.S. Application Data

(63) Continuation of application No. PCT/EP00/08669, filed on Sep. 5, 2000.

(30) Foreign Application Priority Data

Mar. 20, 2000 (DE) .......................... 200 05 123

(51) Int. Cl.$^7$ .................. G01R 1/073; G01R 31/02
(52) U.S. Cl. ...................... 324/761; 324/754
(58) Field of Search .................. 324/761, 754, 324/758, 762, 765, 158.1, 537, 538

(56) References Cited

U.S. PATENT DOCUMENTS

| | | | | |
|---|---|---|---|---|
| 4,017,793 A | * | 4/1977 | Haines ............... | 324/763 |
| 4,820,975 A | | 4/1989 | Diggle ............... | 324/158 |
| 5,381,104 A | | 1/1995 | Kimura et al. ........ | 324/758 |
| 5,408,189 A | | 4/1995 | Swart et al. ......... | 324/758 |
| 5,469,064 A | * | 11/1995 | Kerschner et al. ..... | 324/537 |
| 5,977,776 A | * | 11/1999 | Huth et al. .......... | 324/537 |
| 6,307,389 B1 | | 10/2001 | Buks et al. .......... | 324/758 |
| 2001/0028254 A1 | | 10/2001 | Buks et al. .......... | 324/754 |

FOREIGN PATENT DOCUMENTS

| | | |
|---|---|---|
| DE | 28 00 775 A1 | 7/1979 |
| DE | 40 08 771 A1 | 9/1991 |
| DE | 195 00 416 A1 | 7/1995 |
| DE | 195 03 329 A1 | 8/1996 |
| DE | 198 21 225 A1 | 8/1999 |
| EP | 0 468 153 A1 | 1/1992 |
| EP | 0 447 798 B1 | 9/1995 |
| EP | 0 722 090 A2 | 7/1996 |
| EP | 0 831 332 A1 | 3/1998 |
| EP | 0 874 243 A2 | 10/1998 |
| EP | 0 859 239 A3 | 1/1999 |
| EP | 0 760 104 B1 | 2/1999 |
| JP | 4038480 | 2/1992 |
| WO | WO 99/42850 | 8/1999 |
| WO | WO 00/17662 | 3/2000 |
| WO | WO 01/71371 | 9/2001 |

OTHER PUBLICATIONS

"Open–Frame Product Cradle for Probing," *IBM Technical Disclosure Bulletin*, vol. 38, No. 12, pp. 495–496 (Dec. 1995).

\* cited by examiner

*Primary Examiner*—Ernest Karlsen
(74) *Attorney, Agent, or Firm*—Houston Eliseeva LLP

(57) ABSTRACT

A circuit board tester includes a contact array, contact fingers arranged for travelling in a plane parallel to the contact array, two contact fingers forming a probe pair as a component of a test current circuit, a controller for positioning the contact fingers on circuit board test points of a circuit board to be tested, the circuit boards being insertable into the tester simultaneously during a test procedure being tested, and two sets of contact fingers, one set being arranged for testing the front side and the other set for testing the rear side of a circuit board to be tested. Arranged between the two sets of contact fingers is a holder comprising portions for accommodating at least two circuit b to be tested, at least one of the circuit boards to be tested being insertable in the holder with its front side, and the other circuit board to be tested with its rear side, facing one of the two sets of contact fingers, and the controller is configured such that with both sets of contact fingers the circuit board test points on both the front and rear side of the circuit board to be tested can be contacted during a test procedure.

26 Claims, 4 Drawing Sheets

TESTING DEVICE FOR PRINTED CIRCUIT BOARDS

This is a continuation of International Application PCT/EP00/08669, filed on Sep. 5, 2000, which was published in German under PCT Article 21(2), and which claimed priority to German application No. DE 200 05 123.7 (Mar. 20, 2000), the contents of both applications being incorporated herein by this reference.

BACKGROUND OF THE INVENTION

Devices for testing circuit boards, especially non-componented circuit boards, may be characterized as either as finger testers and parallel testers.

Finger testers are devices in which the individual circuit board test points of a circuit board to be tested are probed in sequence by a probe arranged on a slide, which travels along a cross member over the circuit board to be tested. The probe is positioned over each circuit board test point to be probed, which is then contacted. One such finger tester comprises at least two contact fingers so that it can contact a track of the circuit board to be tested at two circuit board test points and test the section located in between. It can determine whether an open-circuit or short-circuit exists between the test points.

A finger tester is described, for example, in EP 0 486 153 A1. The described design permits the testing of a wide variety of circuit boards without requiring any mechanical modifications. In addition, all and any types of circuit boards can be tested with finger testers.

Parallel testers are testers that by means of a contact array, represented as a rule by an adapter, contact all or at least the majority of the contact locations of a circuit board to be tested simultaneously. Such parallel testers permit fast and safe scanning of a large number of circuit board test points.

The advantage of a parallel tester over a finger tester is that a parallel tester permits much faster testing of a circuit board since all measurements are implemented practically simultaneously. However, every time a change is made in the type of circuit board to be tested a new contact array needs to be provided which, as a rule, is done by producing a new adapter. Parallel testers are preferably put to use in high volume production since they permit a high testing throughput.

It thus follows directly from the above that one of the salient criteria for successful marketing of a finger tester is its speed in testing a circuit board since finger testers are inherently slower than parallel testers.

With the finger tester as known from EP 0 468 153 A1 both the front and rear sides of one or more circuit boards under test can be tested simultaneously. For this purpose two sets of contact fingers are provided, each of which is arranged on one of the two sides of a contact array. The contact array is, as a rule, oriented horizontal so that the one set of contact fingers is arranged above the contact array and the other below the contact array. The circuit boards to be tested are held in the tester, the finger tester, by means of two U-rails locating the circuit boards by their edges.

Also known is to use plate-type product holders for special circuit boards, which can be held by means of two rails opposite each other. Such special circuit boards typically have a shape that is not suitable for insertion in the rails or are floppy and need to be supported on all sides.

It is furthermore known in the case of finger testers to map by means of a camera the offset of each circuit board test point from its ideal position on a circuit board being tested and to take these offsets into account when positioning the contact fingers. Any misplacement of the circuit boards is likewise mapped and taken into account. The circuit boards to be tested are inserted against a stopper in the rails. The individual circuit board test points are then oriented in a system of coordinates defined by the stopper.

For parallel testers, it is known to compensate for any deviation in the actual position from the ideal position of the circuit board test points by shifting the circuit boards or the adapter accordingly. Such methods and devices are disclosed, for example, in U.S. Pat. No. 5,381,104, JP 4038480 and EP 0 874 243 A2. Also known are diverse devices that are used to align the circuit boards relative to the contact array, reference being made in this respect, for example, to EP 0 760 104 B1, U.S. Pat. Nos. 5,408,189, 4,820,975, EP 0 859 239 A3 and EP 0 831 332 A1. Apart from the optical methods of mapping deviations, methods of electrically sensing such deviations are known (e.g. EP 0 874 243 A2).

EP 0 722 090 A2 describes a holding fixture for flat test specimens, which supports the test specimen by retaining means on its two opposite surfaces. At least one of the retaining means is made of an electrically non-conductive film, which may be penetrated by contact fingers.

WO 00/17662 relates to a device for the testing of modules loaded with electrical components. It has a sample holder described as a tray, in which several modules loaded with electrical components may be inserted. These modules have electrical contacts in the area of one edge of their underside. In the area of this edge, the modules are contacted by a support element guidable from below and provided with contact deflection elements, by means of which the electrical contacts of the modules may be deflected upwards. A test head is lowered from above and contacts both these contact deflection elements and also the modules for is testing themselves.

"OPEN-FRAME PRODUCT CRADLE FOR PROBING" IBM TECHNICAL DISCLOSURE BULLETIN, US, IBM CORP. NEW YORK, Vol. 38, No. 12, Dec. 1, 1995, pages 495–496 discloses a product holder in which multi-chip modules or circuit boards may be inserted. For each module and circuit board respectively an opening is provided, with fixing means for fixing the modules and/or circuit boards to the product holder.

SUMMARY OF THE INVENTION

The invention concerns a circuit board tester with enhanced throughput as compared to that of known devices. The invention is also intended to provide a suitable method for increasing the throughput of circuit boards during testing with a finger tester.

In general, according to one aspect, the invention features a circuit board tester in which arranged between the two sets of contact fingers is a holder comprising portions for accommodating at least two circuit boards to be tested. At least one of the circuit boards to be tested is insertable in the holder means with its front side, and the other circuit board to be tested with its rear side, facing one of the two sets of contact fingers. The controller is configured such that with both sets of contact fingers the circuit board test points on both the front and rear sides of the circuit board to be tested can be contacted during a test procedure.

The circuit board tester in accordance with the invention is configured such that the circuit boards can be arranged "reversible", i.e. a certain number of circuit boards is arranged with their front side facing e.g. upwards and the other circuit boards with their rear side facing upwards. This exploits the property of the majority of popular circuit boards that one side features substantially more circuit board test points than the other. Indeed, a ratio of 10:1 is not unusual for the difference in the number of circuit board test points on the front side as compared to the rear side. That is, a circuit board to be tested may have on the front side 10,000 circuit board test points and only 1,000 circuit board test points on the rear side. Since in the device in accordance with the invention the circuit boards to be tested are arranged with both the front and rear sides facing a set of contact fingers and the controller is configured such that both the front and the rear sides of the circuit boards to be tested can be contacted by a set of circuit board test points, roughly the same number of circuit board test points is tested in each case by the two sets of contact fingers. When an even number of circuit boards can be inserted into the tester, preferably half of the circuit boards is arranged in the tester with the front side facing the one set and the other half of the circuit boards with the rear side facing the other set. This results in the same number of front sides and rear sides of both sets of circuit boards of the type under test being tested and thus both sets of contact fingers test the same number of circuit board test points. This arrangement ensures that both sets of contact fingers perform precisely the same amount of work per cycle.

In prior art testers only one of the two sets of contact fingers was utilized during a load/unload cycle, namely the set of contact fingers contacting the side of the circuit board to be tested having the most circuit board test points whereas the other set of contact fingers in prior art testers merely contacts a substantially smaller number of circuit board test points. This is the reason why during testing, this set of circuit board test points often has to wait idle until the other set of circuit board test points has concluded sensing. This dead time is eliminated or at least reduced to a minimum by the tester in accordance with the invention.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
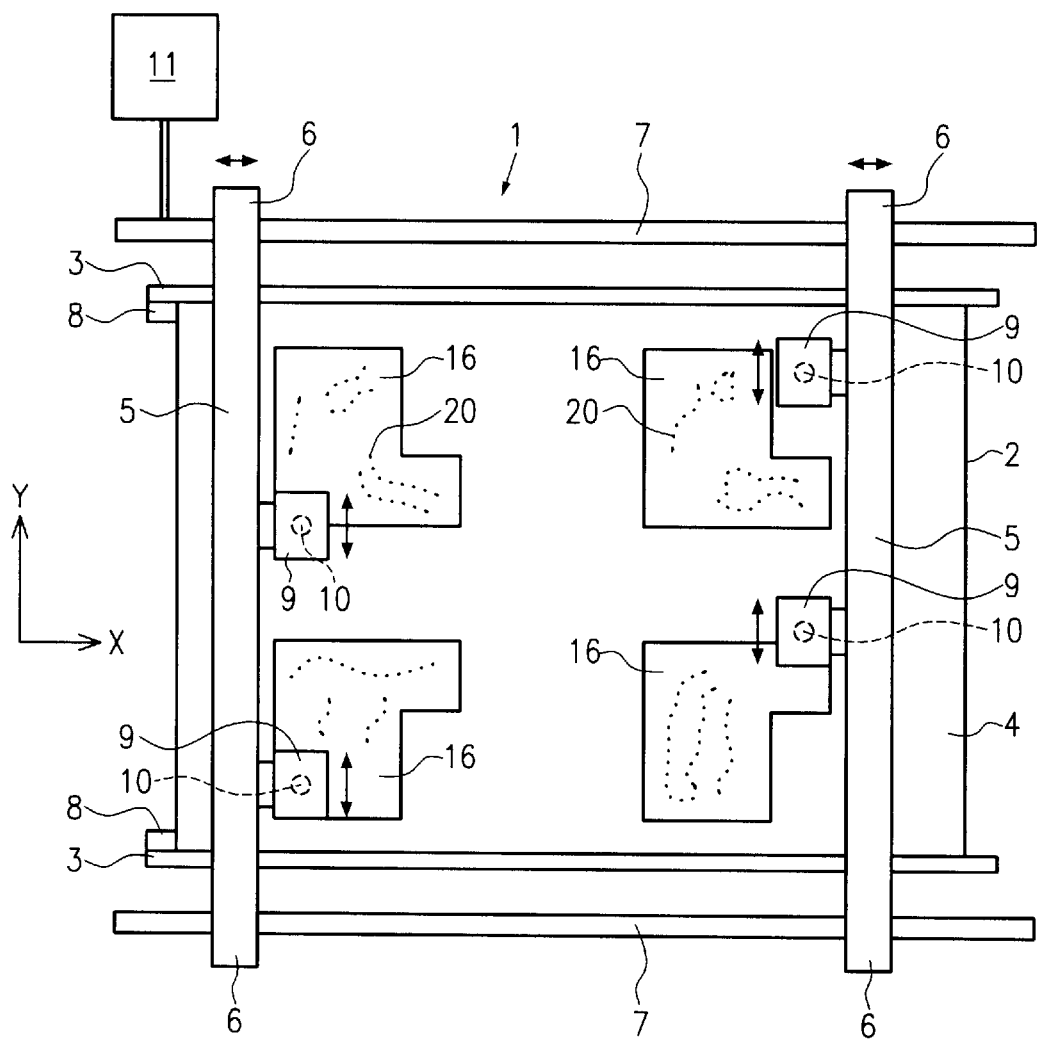
FIG. 1 is a plan view of the circuit board tester in accordance with the invention.

Referring now to FIG. 1 there is illustrated a tester, which has been constructed according to the principles of the present invention.

Figure 2:
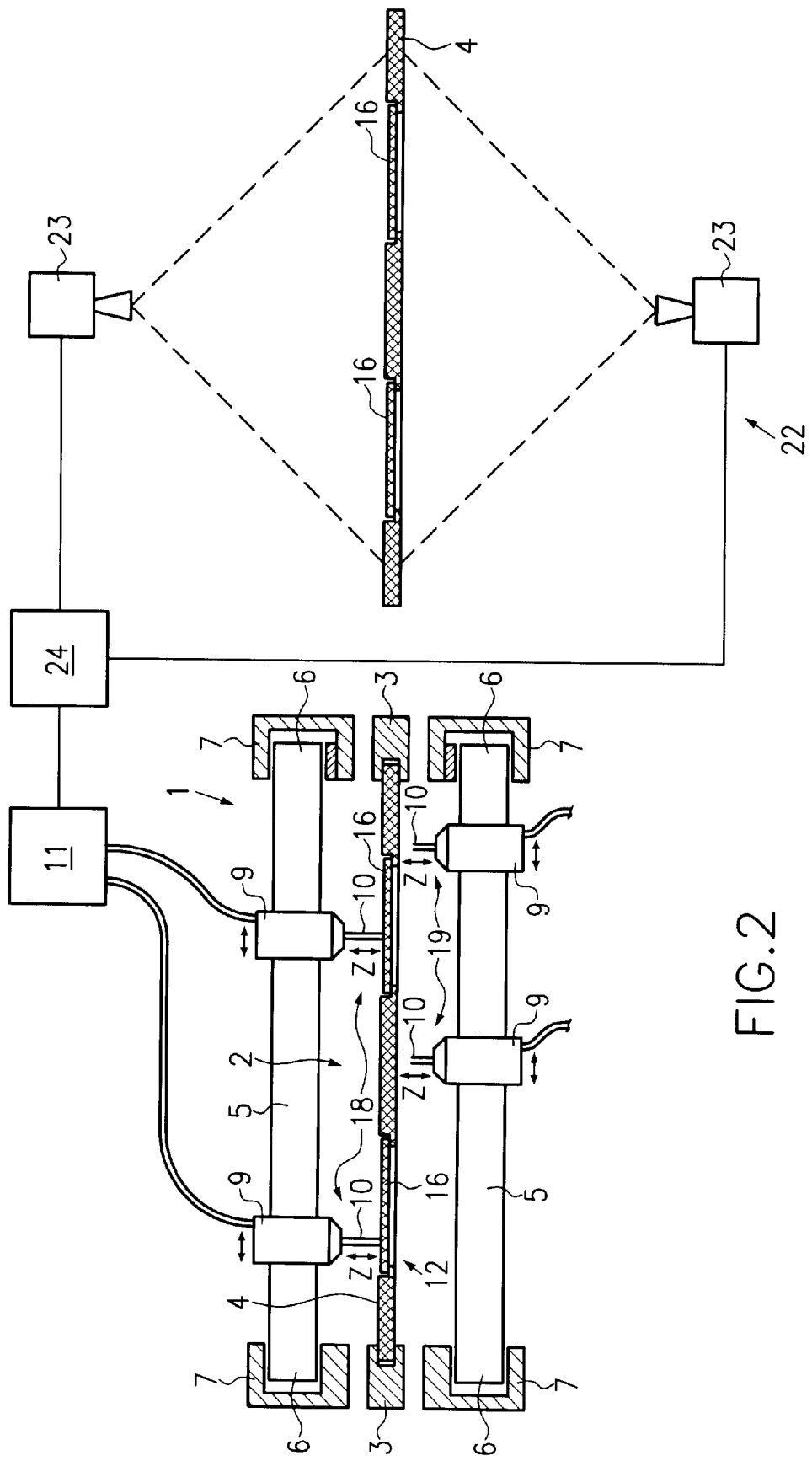
FIG. 2 is a side view of the device as shown in FIG. 1.

The tester 1 comprises a test array 2 defined laterally by means of two U-rails 3 for receiving a holder plate 4 in accordance with the invention (FIG. 2). The U-rails 3 have a U-shaped cross-section.

The extent of the test array 2 is covered by two cross members 5 arranged for travelling by their end portions 6 on guide rails 7.

One of the U-rails 3 in each case is arranged parallel and adjacent to one of the guide rails 7. The U-rails 3 and their openings face the test array 2 and are provided at each end with a stopper 8 so that the holder plate 4 can be inserted into the U-rails 3 until it comes up against the stopper 8. Arranged travelling on the cross members 5 are positioning members 9, each of which comprises a contact finger 10 that is capable of moving vertically or arranged vertically shiftable (in the Z direction) on the corresponding positioning member 9.

Since the cross members 5 can be travelled along the guide rails 7 and the positioning members 9 along the cross members 5, the positioning members 9 can be travelled to any location in the X-direction and Y-direction in the plane of the test array 2. Movement of the positioning members and contact fingers 10 is controlled by a controller 11.

Provided in the holder plate 4 are windows 12 (FIGS. 3, 4a) corresponding to the shape of the circuit board to be tested. Each of the windows 12 comprises a locating edge 13 represented in the example embodiment as shown by a vertically oriented locating wall 14 and a ledge 15 on all sides of the locating edge 13, the ledge 15 being configured below the locating wall 14 integral with the holder plate 4 such that it ends flush with the lower side surface area thereof.

The locating wall 14 of a window 12 is precisely adapted to the shape of a circuit board 16 to be tested so that the circuit board 16 can be positively located in the window 12 from which it is prevented from falling out by the ledge 15 serving as a holder element.

Figure 4A:
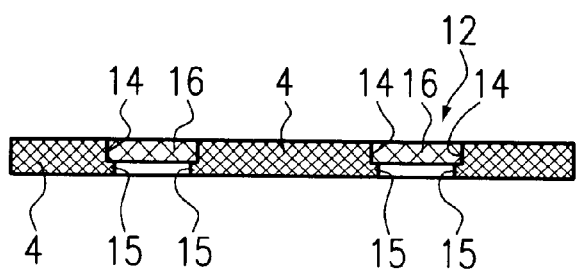
FIG. 4a is section taken through the holder plate (including circuit boards) as shown in FIG. 3 along the line A—A in the viewing direction of the arrow.
Figure 4B:
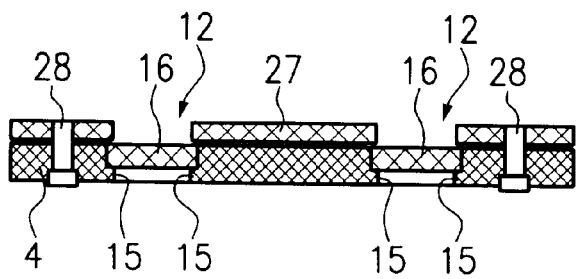
FIG. 4b is a section view of a further embodiment of the holder plate (including circuit boards)

It is to be noted that the holder plate 4 as shown in FIG. 4b does not need to be configured with positively locating windows 12 since the circuit boards 16 to be tested are fixed in place between the ledges 15 of the holder plate 4 and on a counterplate 27 arranged on the holder plate 4. The counterplate is secured by a screw fastener 28 to the holder plate 4 such that the circuit boards to be tested are clamped in place between the counterplate 27 and the holder plate 4 and thus fixedly or securely located.

For fixedly locating the circuit boards 16 to be tested sticky tape may also be used instead of a counterplate.

Figure 3:
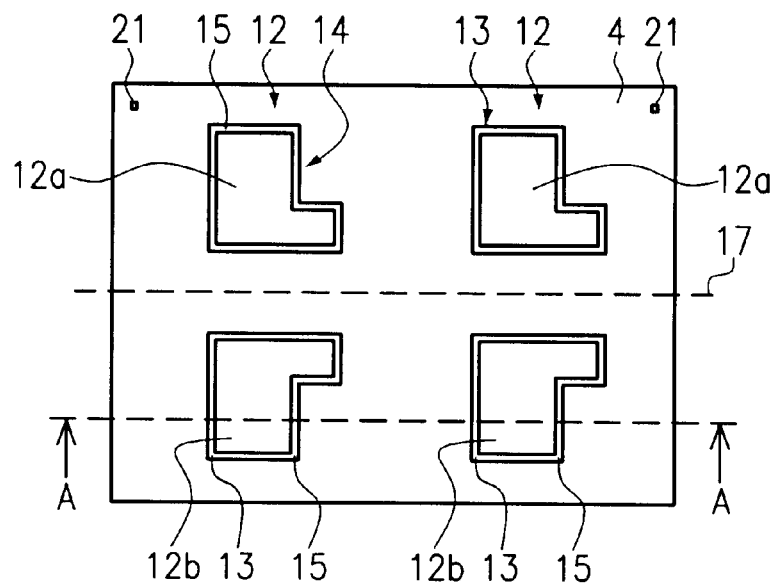
FIG. 3 is a plan view of a holder plate (without circuit boards) in accordance with the invention.

Provided on the holder plate 4 are two kinds of windows 12a, 12b, which in the plan view are configured mirror-symmetrical to each other. In the example embodiment as shown in FIG. 3 the windows 12a, 12b are each arranged mirror-symmetrical about the axis of symmetry 17. However, the windows 12 may also be arranged staggered or rotated in any other direction, so that no axis of symmetry is definable between a pair of mirror-symmetrical windows, in other implementations.

What is important to the invention is that the circuit boards 16 to be tested can be inserted in the holder plate 4 such that a portion of the circuit boards 16 can be inserted with their front sides facing one side of the holder plate 4 and another portion of the circuit boards inserted with their front sides facing the other side of the holder plate 4. In the example embodiment as shown circuit boards are arranged in the windows 12a with their rear sides resting on the ledges 15, whereas in the windows 12b they are inserted with their front sides resting on the ledges 15. In other words, some of the circuit boards 16 are held in the holder plate 4 in a frontside up orientation whereas other circuit boards 16 are held in the holder in a backside up orientation.

Several circuit boards 16 to be tested are inserted in the holder plate 4. In the illustrated example, four circuit boards 16 to be tested are involved. They are inserted as a unit into the U-rails 3 of the tester up to the stopper 8.

Since a portion of the circuit boards 16 to be tested have their front sides facing the upper contact fingers 10—first set 18 of contact fingers—and the other portion of the circuit boards face the lower contact fingers 10—second set 19 of contact fingers—both sets 18, 19 face respectively face and rear sides of the circuit boards 16 to be tested (FIG. 2).

The controller 11 is configured such that with the contact fingers 10 of both sets 18, 19 can contact the circuit board test points 20 of the front and rear sides of the circuit boards 16 to be tested.

For this purpose, the circuit board test programs (in which the coordinates of the circuit board test points and the sequence in which the circuit board test points 20 are contacted are specified) accommodate the fact that circuit boards 16 are inserted reversed between the two sets of contact fingers 18, 19. The controller in accordance with the invention thus comprises a "normal" test program for the circuit boards whose front sides face upwards and an "upside-down" test program for the circuit boards inserted reversed, whose rear sides face upwards. These test programs are replicated corresponding to the number of circuit boards inserted in the holder plate 4 in each case and scaled to the corresponding positions of the circuit boards in the holder plate 4 in the tester 1.

It is usually the case that the number of circuit board test points is a significantly between the front and rear sides of the circuit board to be tested. The ratio of the circuit board test points, front side to rear side, is often in the range of 3:1 to 20:1. Circuit boards also exist which have no rear side circuit board test points. Since with the device in accordance with the invention both contact finger sets 18, 19 contact both front and rear sides of the circuit board to be tested, a mean number of circuit board test points is contacted by both contact finger sets 18, 19, as compared to the case that a set of contact fingers merely contacts only front sides and the other set of contact fingers merely contact only rear sides of the circuit board to be tested. In the ideal case in which the same number of circuit boards with their front sides facing the one set of contact fingers is arranged to face the other set of contact fingers, precisely the same number of circuit board test points is to be contacted in each case by each set of contact fingers. In such an arrangement both sets of contact fingers are required to perform exactly the same during testing whilst all circuit boards insertable in the tester are tested. This results in a considerable time-saving as compared to prior art testers in which the one set of contact fingers merely tests the front sides and the other set merely tests the rear sides of the circuit board to be tested, since in these known devices the set of contact fingers being required to contact the smaller number of circuit board test points is never fully utilized, resulting in considerable dead times during which the contact fingers of the one set have to wait until the contact fingers of the other set have performed the corresponding test measurements.

Provided preferably on the holder plate 4 are at least two electrically conducting contact points 21 for detecting by the contact fingers 10 (FIG. 3), thus enabling the position of the holder plate 4 in the tester 1 to be defined. Once the position of the holder plate 4 has been defined, the positions of the circuit board 16 to be tested are also defined relative to the tester 1 since these are positively located in the holder plate 4, thus enabling the test programs for the individual circuit boards to be tested to be scaled correspondingly in the X/Y coordinate system.

In one preferred embodiment of the tester in accordance with the invention (FIG. 2), a station is provided for mapping the offset of each and every circuit board test point from its ideal position and for mapping the displacements of the circuit boards. This mapping station comprises two cameras 23 with which one side each of the holder plate 4 is totally mapped. The cameras are electrically connected to an analyser 24, which digitally analyses the image signals captured by the cameras 23 in determining the offsets and displacements. These methods find application more particularly for circuit boards that have a very high circuit board test point density and very small circuit board test points since the offsets and displacement materializing from production of such circuit boards to be tested are roughly the same in magnitude as the circuit board test points, resulting in faulty contacting due to such offsets and displacements as caused by misalignment. With the cameras 23 and the analyser 24, the deviation of each circuit board test points from the ideal position is mapped. The thus obtained "deviation data" are passed on from the analyser 24 to the controller 11 and correspondingly taken into account when travelling the contact finger 10 in testing so that each of the individual circuit board test points is correctly contacted.

The deviation data of the circuit board test points of the individual circuit boards 16 inserted in the holder plate 4 are determined with reference to an X/Y-coordinate system dictated by the holder plate 4. This system of coordinates is defined, for example, by the contact points 21 applied to the holder plate 4.

In a further preferred embodiment of the tester in accordance with the invention, the holder plates 4 are automatically transported, for example, by means of conveyor belts, from the mapping station 22 into the test array 2. In one such automated tester a further holder plate 4 in which a further circuit board 16 to be tested is inserted is mapped in the test procedure carried out at the test array 2. By providing the second holder plate 4, it is thus possible to map the offsets and displacements irrespective of the test array 2. In prior art testers the offsets and displacements are mapped after the circuit boards have been inserted in the test array. Whilst mapping the offsets and displacements, actual testing cannot be done, this being the reason why mapping needs to be implemented as quickly as possible to avoid excessively limiting the time available for testing. Now, with the device in accordance with the invention, substantially more time is available for mapping the offsets and displacements in thus enabling the individual circuit board test points to be sensed substantially more accurately. This greatly enhances the throughput and quality in testing especially circuit boards having a high circuit board test point density and very small circuit board test points, since the circuit board test points are now much more precisely sensed.

Figure 5:
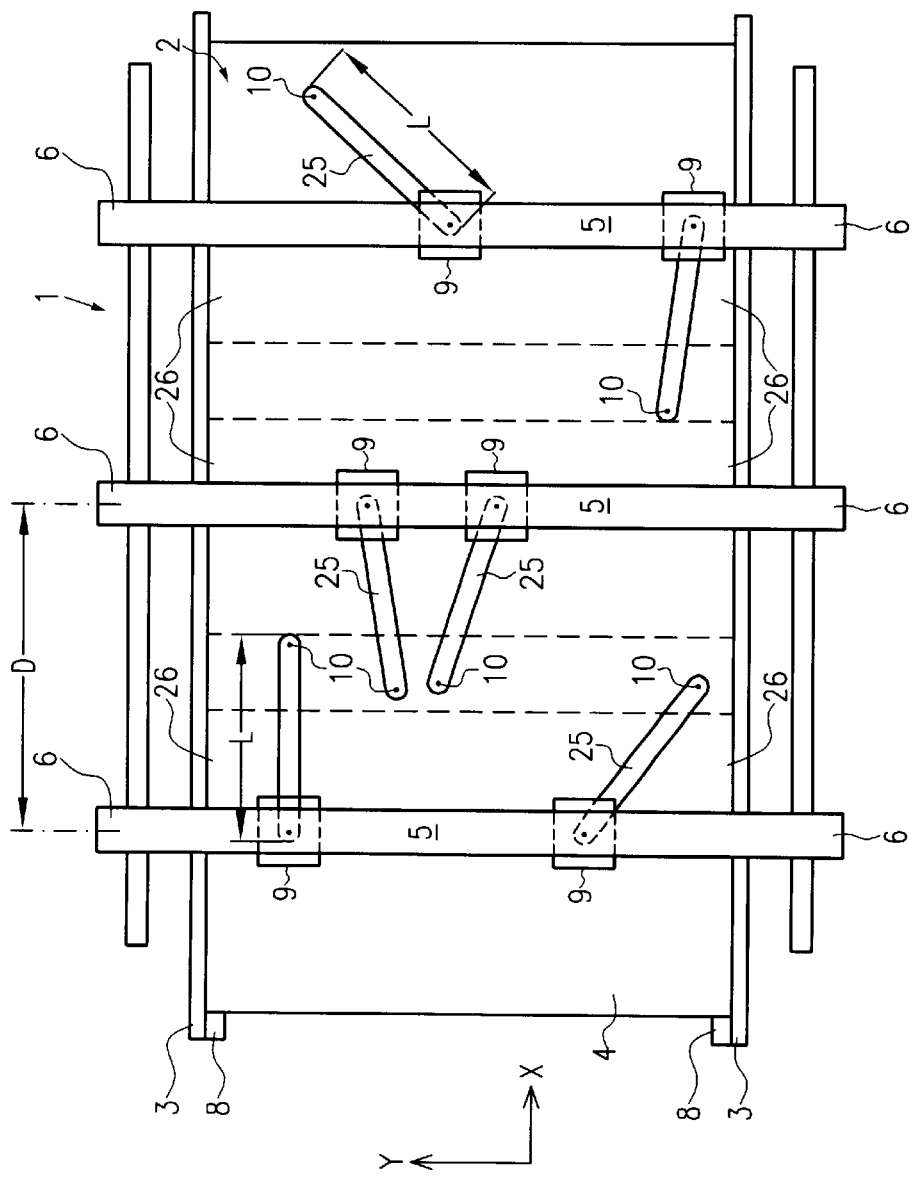
FIG. 5 is plan view of a further example embodiment of a circuit board tester in accordance with the invention including fixed cross members and swivel arms on which the contact fingers are arranged.

Referring now to FIG. 5, there is illustrated a further example embodiment of a tester in accordance with the invention. This tester comprises a simple mechanical configuration including fixed cross members 5 on which positioning members 9 are travelled. The positioning members 9 are provided with swivel arms 25 swivel-mounted in a plane parallel to the test array 2 at the positioning members 9. At the ends of the swivel arms 25 remote from the positioning members 9, the contact fingers 10 are arranged for contacting the circuit board test points. The distance D between two adjacent cross members 5 is smaller than twice the length L of the swivel arms 25. With the contact fingers 10 assigned to a cross member 5, a test zone 26 of the test array 2 can be scanned, whose edges are spaced away from the cross members 5 by a distance L. These test zones 26 overlap at their edge portions and thus in these overlapping portions the contact fingers 10 of two different cross members 5 are able to scan the test array, permitting faster testing. The holder plate 4 in accordance with the invention is thus configured so that the windows 12 and thus the circuit boards 16 to be tested are arranged in these overlapping portions of the test zones 26 to thus further enhance the testing speed of the tester.

The arrangement of the windows 12 may be further optimized by means of a computer program so that roughly the same number of circuit board test points is contacted by the individual cross members. Such a computer program thus implements a method for automatically determining the ideal arrangement of the circuit boards to be tested on the test array 2 of the tester 1, i.e. the arrangement of the circuit boards to be tested is thus optimized not only in regard to the sets of contact fingers but also in regard to the individual cross members.

For other kinds of testers the positions of the windows 12 can be defined optimized in accordance with the specifications of these further testers.

The advantages achieved by the invention may be summarized as follows: 1) a substantially improved performance of the two sets of contact fingers is achieved since they contact roughly the same number of circuit board test points during testing; 2) with the optional mapping station, offsets and displacements can be mapped in advance with high precision and defined in regard to a system of coordinates as dictated by the holder (holder plate 4); 3) when making use of the holder plate 4 with a ledge 15 on all sides and a locating wall 14 forming positive location of the circuit board to be tested, high positioning accuracy and rugged security is achieved compatible with circuit boards of any shape and size; 4) by making use of a holder plate suitable for mounting several circuit boards to be tested, the time needed to load and unload the tester is reduced; and 5) since several circuit boards to be tested are handled and tested simultaneously an automated effect materializes.

Whilst the invention has been detailed above by way of example embodiments it is understood that it is not restricted to any concrete embodiment of the example concerned. For instance, it is also possible without departing from the scope of the invention to provide on the holder plate 4 several ledges arranged sectionwise instead of a single ledge 15 on all sides of the locating edge 13 of the window 12. Instead of a single holder plate, any number of other holders may be provided for locating at least two circuit boards, whereby one of the circuit boards is arranged with its face side facing upwards and the other can be arranged with its rear facing upwards.

What is claimed is:

1. A circuit board tester including:
    a test array,
    two sets of contact fingers arranged for travelling in a plane parallel to said test array, one set being arranged for testing a front side and the other set for testing a rear side of a circuit board to be tested, two contact fingers forming a probe pair as a component of a test current circuit;
    a controller for positioning said contact fingers on circuit board test points of circuit boards to be tested, said circuit boards being insertable into said tester simultaneously during a test procedure;
    arranged between said two sets of contact fingers is a holder for holding the circuit boards to be tested,
    wherein the holder has portions for accommodating at least two circuit boards to be tested, at least one of said circuit boards to be tested being insertable in said holder with its front side, and the other circuit board to be tested with its rear side, facing one of said two sets of contact fingers, and said controller is configured such that with both sets of contact fingers the circuit board test points on both the front and rear sides of said circuit board to be tested can be contacted during a test procedure.

2. The tester as set forth in claim 1, wherein said holder comprises a holder plate in which windows are provided having roughly the shape of said circuit boards to be tested and provided with holding elements for holding said circuit boards to be tested.

3. The tester as set forth in claim 2, wherein roughly half of said circuit boards to be tested are insertable in said holder plate with their front side facing one of said sets of contact fingers and the other half of said circuit boards to be tested being inserted with their rear side facing the other set of contact fingers.

4. The tester as set forth in claim 3, wherein said holding elements are configured as ledges protruding from the locating edge of said windows.

5. The tester as set forth in claim 4, wherein said ledges are milled integrally with said holder plate and produced by milling from a plate blank.

6. The tester as set forth in claim 5, wherein the shape of a first window in viewing said holder plate from above corresponds to the shape of a circuit board to be tested and the shape of a second window viewed from above is mirror-symmetrical to said first window.

7. The tester as set forth in claim 6, wherein several pairs of mirror-symmetrical windows are provided.

8. The tester as set forth in claim 7, wherein cross members cover the extent of said test array and are arranged stationary, and said contact fingers are arranged by means of swivel arms on said cross members so that said contact fingers cover a strip-shaped test zone of said test array, said test zones of adjacent cross members overlapping and a pair of mirror-symmetrical configured windows is arranged in said overlapping portion of adjacent test zones.

9. The tester as set forth in claim 8, wherein a mapping station for mapping offsets and/or displacements of said circuit board test points is provided, said mapping station being arranged outside of said test array and configured such that said individual circuit boards are inserted in said holder plate permitting mapping relative to a system of coordinates defined by said holder.

10. The tester as set forth in claim 9, wherein said holder comprises at least two electric contacts for contacting by means of said contact fingers to detect the position of said holder in said test array of said tester.

11. The tester as set forth in claim 1, wherein said holder comprises a holder plate in which windows are provided having roughly the shape of said circuit boards to be tested and provided with holding elements for holding said circuit boards to be tested.

12. The tester as set forth in claim 11, wherein said holding elements are configured as ledges protruding from the locating edge of said windows.

13. The tester as set forth in claim 12, wherein said ledges are milled integrally with said holder plate and produced by milling from a plate blank.

14. The tester as set forth in claim 11, wherein the shape of a first window in viewing said holder plate from above corresponds to the shape of a circuit board to be tested and the shape of a second window viewed from above is mirror-symmetrical to said first window.

15. The tester as set forth in claim 14, wherein several pairs of mirror-symmetrical windows are provided.

16. The tester as set forth in claim 15, wherein cross members cover the extent of said test array and are arranged stationary and said contact fingers are arranged by means of swivel arms on said cross members so that said contact fingers cover a strip-shaped test zone of said test array, said test zones of adjacent cross members overlapping and a pair of mirror-symmetrical configured windows is arranged in said overlapping portion of adjacent test zones.

17. The tester as set forth in claim 1, wherein a mapping station for mapping offsets and/or displacements of said circuit board test points is provided, said mapping station being arranged outside of said test array and configured such that said individual circuit boards are inserted in said holder plate permitting mapping relative to a system of coordinates defined by said holder.

18. The tester as set forth in claim 17, wherein said holder comprises at least two electric contacts for contacting by means of said contact fingers to detect the position of said holder in said test array of said tester.

19. Method for the testing of circuit boards, wherein contact fingers of a tester are moved in a plane parallel to a test array, and two contact fingers form a probe pair which is part of a test circuit, the method comprising:

the contact fingers being positioned on circuit board test points of a circuit board to be tested, in order to test during a test process several circuit boards which may be inserted in the tester simultaneously;

two sets of contact fingers being provided, wherein one set is arrange to test the front side and the other set to test the rear side of a circuit board to be tested;

the circuit boards to be tested being located between the two sets of contact fingers by a holder;

the holder having portions for accommodating at least two circuit boards to be tested, at least one of said circuit boards to be tested being insertable in said holder with its front side, and the other circuit board to be tested with its rear side, facing one of said two sets of contact fingers, and both sets of contact fingers contacting the circuit board test points on both the front and rear sides of said circuit board to be tested during a test procedure.

20. A circuit board tester, comprising:

holder for holding at least two circuit boards to be tested;

at least two sets of contact fingers being arranged on opposed sides of the holder to thereby test both sides of the at least two circuit boards; and a controller for positioning said contact fingers on circuit board test points of the circuit boards to be tested;

wherein the holder has portions for accommodating the at least two circuit boards such that one of the circuit boards is held in front side up orientation and the other one of the circuit boards is held in a rear side up orientation;

the controller driving a first set of the at least two sets of contact fingers to contact test points on a front side of the circuit board in the front side up orientation and contact test points on a rear side of the circuit board in the rear side up orientation while driving a second set of the at least two sets of contact fingers to contact test points on a rear side of the circuit board in the front side up orientation and contact test points on a front side of the circuit board in the rear side up orientation.

21. A method for the testing of circuit boards, comprising:

inserting a first circuit board into a holder in a frontside up orientation;

inserting a second circuit board into the holder in a backside up orientation; and contacting circuit board test points to test the circuit boards with a first set of contact fingers located on a first side of the holder while contacting circuit board test points to test the circuit boards with a second set of contact fingers located on a second side of the holder.

22. The tester as set forth in claim 20, wherein said holder comprises a holder plate in which windows are provided having roughly the shape of said at least two circuit boards and provided with holding elements for holding said circuit boards.

23. The tester as set forth in claim 22, wherein roughly half of said circuit boards are insertable in said holder plate in front side up orientation and the other half of the circuit boards is held in a rear side up orientation.

24. The tester as set forth in claim 20, further comprising a mapping station for mapping offsets and/or displacements of circuit board test points, said mapping station permitting mapping relative to a system of coordinates defined by said holder.

25. The tester as set forth in claim 20, wherein said holder comprises at least two electric contacts for being contacted by said contact fingers to detect the position of said holder in said tester.

26. A method as claimed in claim 21, further comprising mapping offsets and/or displacements of circuit board test points relative to a system of coordinates defined by said holder.

* * * * *